United States Patent
Wang et al.

(10) Patent No.: US 7,098,758 B2
(45) Date of Patent: Aug. 29, 2006

(54) ACOUSTICALLY COUPLED THIN-FILM RESONATORS HAVING AN ELECTRODE WITH A TAPERED EDGE

(75) Inventors: Kun Wang, Sunnyvale, CA (US); Paul D. Bradley, Los Altos, CA (US); Richard C. Ruby, Menlo Park, CA (US); Hongjun Feng, Windsor, CO (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 115 days.

(21) Appl. No.: 10/980,562

(22) Filed: Nov. 3, 2004

(65) Prior Publication Data

US 2006/0091978 A1   May 4, 2006

(51) Int. Cl.
*H03H 9/54* (2006.01)
*H03H 9/13* (2006.01)

(52) U.S. Cl. .................. 333/189; 333/191; 310/365
(58) Field of Classification Search ............... 333/187, 333/189
See application file for complete search history.

(56) References Cited

U.S. PATENT DOCUMENTS

| | | | |
|---|---|---|---|
| 3,582,839 A | 6/1971 | Pim et al. | 333/191 |
| 4,320,365 A | 3/1982 | Black et al. | 333/187 |
| 4,625,138 A * | 11/1986 | Ballato | 310/320 |
| 5,587,620 A | 12/1996 | Ruby et al. | 310/346 |
| 6,060,818 A | 5/2000 | Ruby et al. | 310/363 |
| 6,215,375 B1 | 4/2001 | Larson, III et al. | 333/187 |
| 6,262,637 B1 | 7/2001 | Bradley et al. | 333/133 |
| 6,384,697 B1 | 5/2002 | Ruby | 333/189 |
| 6,424,237 B1 | 7/2002 | Ruby et al. | 333/187 |
| 6,472,954 B1 | 10/2002 | Ruby et al. | 333/133 |
| 6,476,536 B1 | 11/2002 | Pensala | 310/312 |
| 6,534,900 B1 | 3/2003 | Aigner et al. | 310/326 |
| 6,600,390 B1 | 7/2003 | Frank | 333/189 |
| 6,657,363 B1 | 12/2003 | Aigner | 310/324 |
| 6,693,500 B1 | 2/2004 | Yang et al. | 333/189 |
| 6,710,508 B1 | 3/2004 | Ruby et al. | 310/312 |
| 6,714,102 B1 | 3/2004 | Ruby et al. | 333/189 |
| 6,720,844 B1 | 4/2004 | Lakin | 333/189 |
| 6,720,846 B1 | 4/2004 | Iwashita et al. | 333/193 |
| 6,924,717 B1 * | 8/2005 | Ginsburg et al. | 333/187 |
| 6,998,940 B1 * | 2/2006 | Metzger | 333/187 |
| 2003/0111439 A1 * | 6/2003 | Fetter et al. | 216/13 |
| 2003/0141946 A1 | 7/2003 | Ruby et al. | 333/187 |
| 2004/0263287 A1 | 12/2004 | Ginsburg et al. | 333/187 |
| 2005/0012570 A1 | 1/2005 | Korden et al. | 333/189 |
| 2005/0030126 A1 | 2/2005 | Inoue et al. | 333/133 |

FOREIGN PATENT DOCUMENTS

| | | |
|---|---|---|
| WO | WO 01/06647 | 1/2001 |
| WO | WO 01/99276 A1 | 12/2001 |

OTHER PUBLICATIONS

A partial copy of GB Search Report for Application No. GB0522393.8 mailed Jan. 9, 2006 (4 pgs.).

* cited by examiner

*Primary Examiner*—Barbara Summons

(57) ABSTRACT

Acoustically coupled resonators include a first and a second acoustic resonator. Both the first and second acoustic resonators include a first electrode, a layer of piezoelectric material, and a second electrode. The first electrode is adjacent a first surface of the layer of piezoelectric material. The second electrode is adjacent a second surface of the layer of piezoelectric material. At least the second electrode has an edge that is tapered.

23 Claims, 16 Drawing Sheets

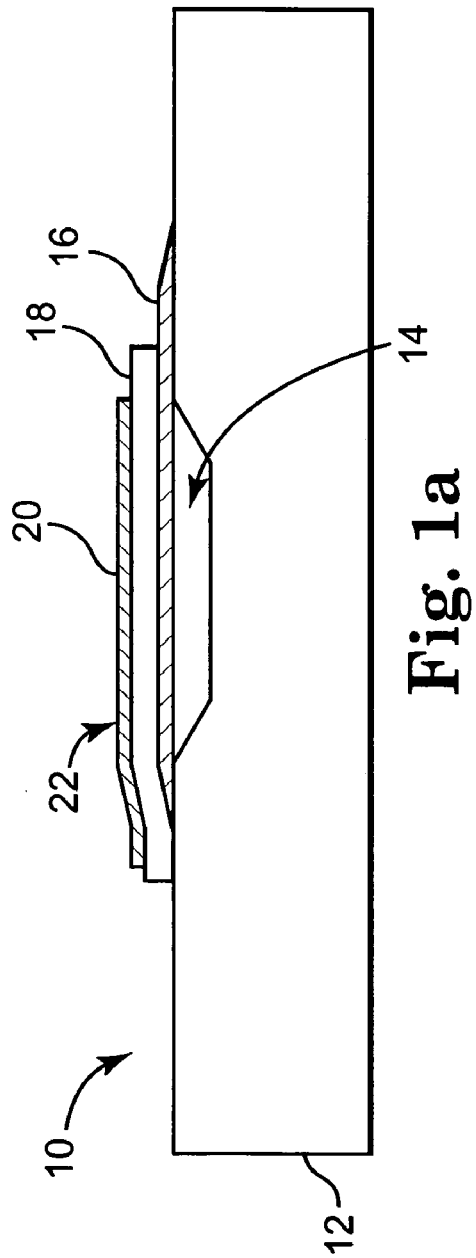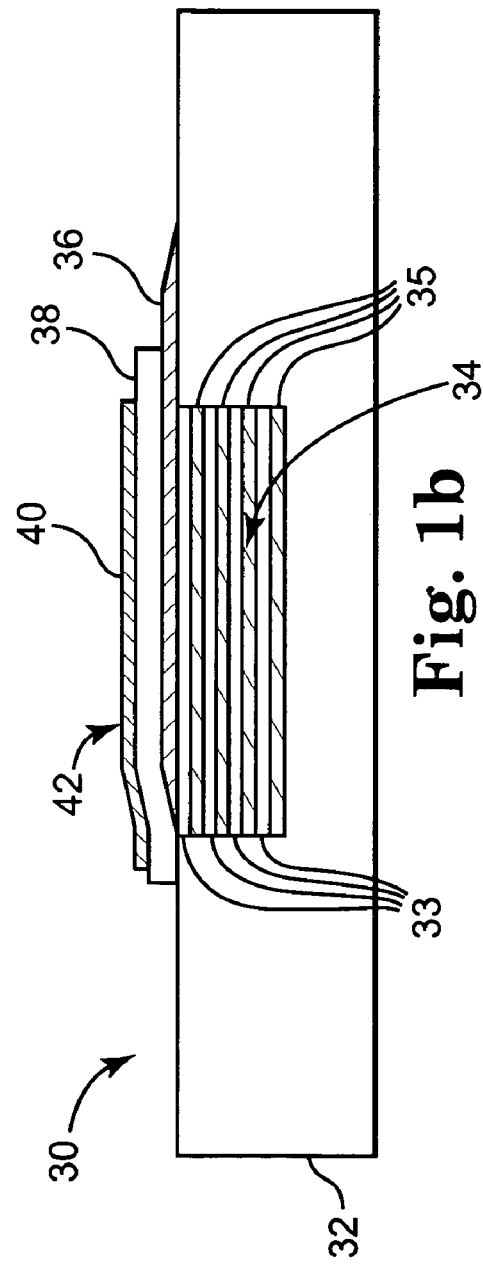

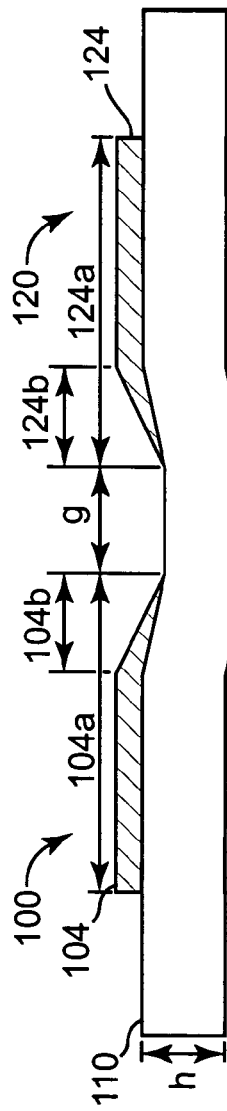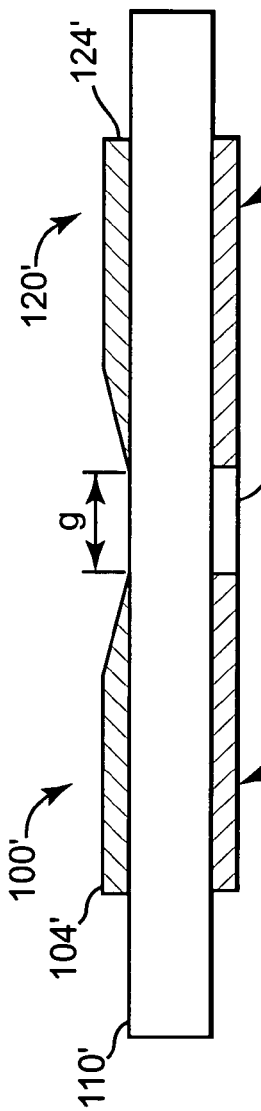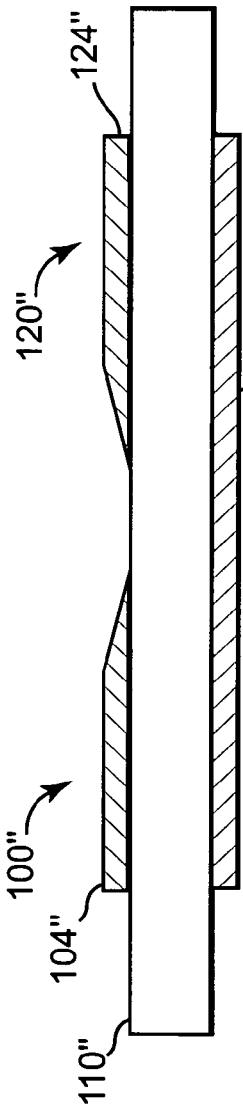

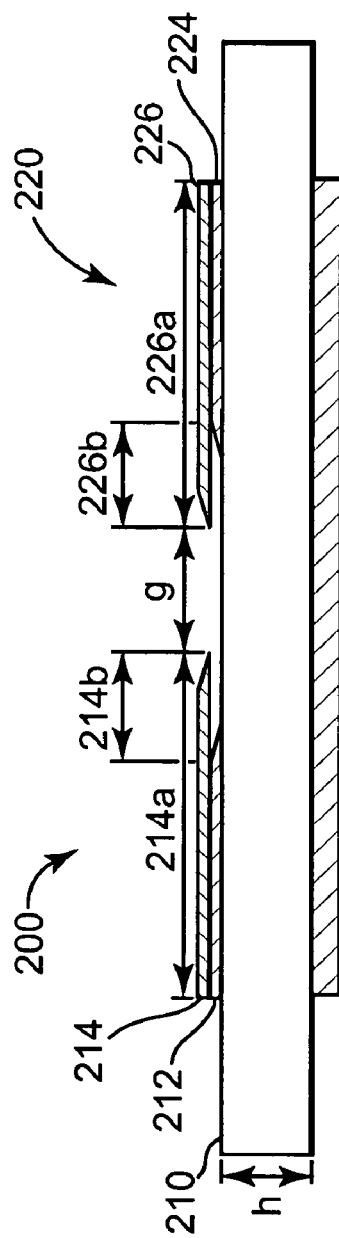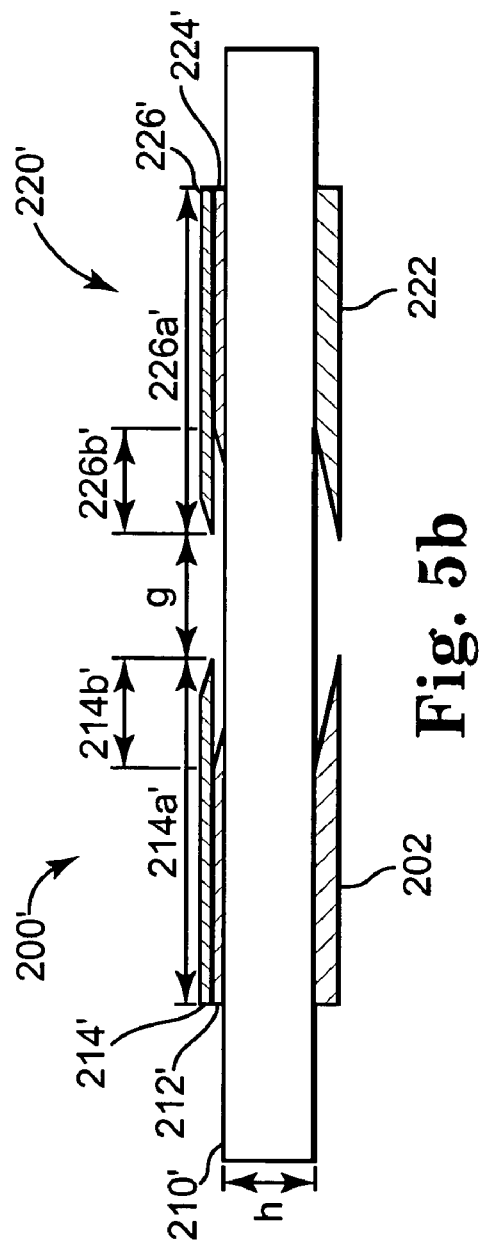

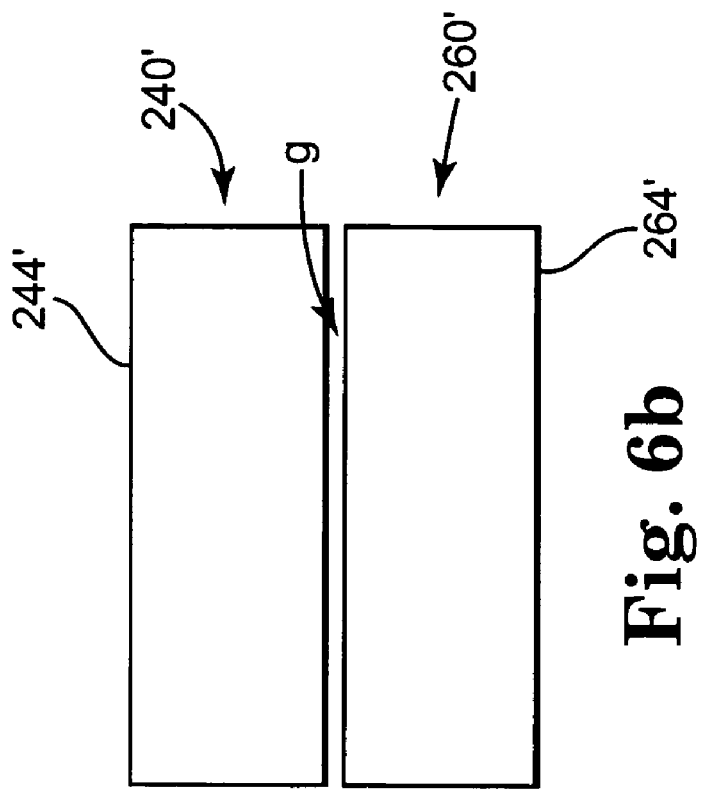
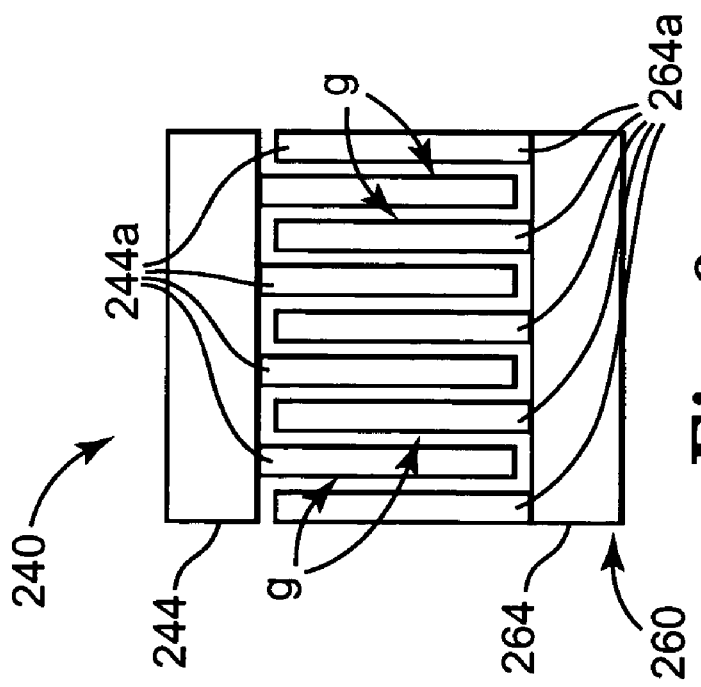
Fig. 6b
Fig. 6a

ACOUSTICALLY COUPLED THIN-FILM RESONATORS HAVING AN ELECTRODE WITH A TAPERED EDGE

BACKGROUND

The need to reduce the cost and size of electronic equipment has created a need for smaller signal filtering elements. Thin-Film Bulk Acoustic Resonators (FBARs) and Stacked Thin-Film Bulk Wave Acoustic Resonators (SBARs) represent one class of filter elements with potential for meeting these needs. These filters can collectively be referred to as FBARs. An FBAR is constructed from acoustic resonators using bulk longitudinal acoustic waves in thin-film piezoelectric (PZ) material. Typically, an FBAR includes a layer of PZ material sandwiched between two metal electrodes. The combination PZ material and electrodes are suspended in air by supporting the combination around its perimeter or placing the combination over an acoustical mirror.

When an electrical field is created between the two electrodes, the PZ material converts some of the electrical energy into mechanical energy in the form of acoustic waves. The acoustic waves propagate in the same direction as the electric field and reflect off the electrode-air or electrode-acoustical mirror interface at some frequency, including at a resonance frequency. At the resonance frequency, the device can be used as an electronic resonator. Multiple FBARs can be combined such that each are elements in RF filters.

There is a need to synthesize FBAR filters in certain circuit applications. Currently, it is typical for electrical coupling to be used in synthesizing FBAR filters. Electrical coupling of FBAR filters greatly limits the ability to achieve various filter types and performances in wireless communication applications such as broadband attenuation, impedance transformation, and single-in-differential-out conversion. Although some surface acoustic wave (SAW) filters have been synthesized using acoustic coupling, such acoustic coupling has not been effective in synthesizing FBAR filters.

For these and other reasons, a need exists for the present invention.

SUMMARY

One aspect of the present invention provides acoustically coupled resonators having a first and a second acoustic resonator. Both the first and second acoustic resonators include a first electrode, a layer of piezoelectric material, and a second electrode. The first electrode is adjacent a first surface of the layer of piezoelectric material. The second electrode is adjacent a second surface of the layer of piezoelectric material. At least the second electrode has an edge that is tapered.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 1a illustrates an air-suspended FBAR.

FIG. 1b illustrates a solid mounted FBAR (SMR).

FIGS. 4a–c illustrate two acoustically coupled resonators with electrodes having tapered edges in accordance with various embodiments of the present invention.

FIGS. 5a–b illustrate two acoustically coupled resonators with electrodes having tapered edges in accordance with alternative embodiments of the present invention.

FIG. 6a illustrates a top view of an acoustic resonator having electrodes with inter-digital fingers in accordance with one embodiment of the present invention.

FIG. 6b illustrates a top view of an acoustic resonator having slim electrodes in accordance with one embodiment of the present invention.

FIG. 10b illustrates a typical simulated characteristic of the circuit illustrated in FIG. 10a.

FIG. 11b illustrates a typical simulated characteristic of the circuit illustrated in FIG. 11a.

FIG. 14b illustrates a typical simulated characteristic of the circuit illustrated in FIG. 14a.

FIG. 16b illustrates a typical simulated characteristic of the circuit illustrated in FIG. 16a.

DETAILED DESCRIPTION

Figure 2A:
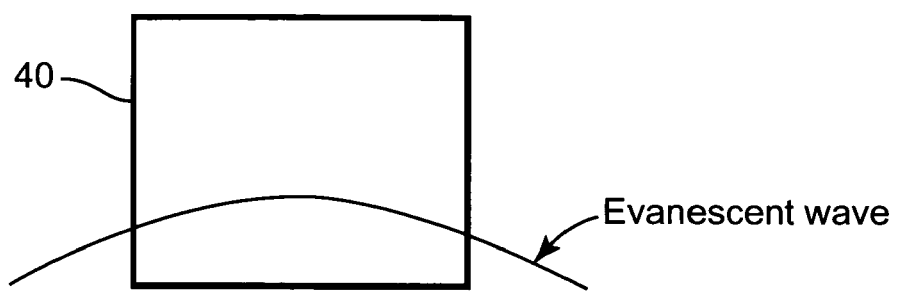
FIG. 2a illustrates a cavity resonator.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

FIGS. 1a and 1b illustrate acoustic filter elements in cross-sectional view. FIG. 1a illustrates FBAR 10 in a cross-sectional view. FBAR 10 includes substrate 12, depression 14, first electrode 16, piezoelectric (PZ) layer 18, and second electrode 20. First electrode 16, PZ layer 18, and second electrode 20 collectively form FBAR membrane 22. FBAR membrane 22 is supported on substrate 12 and suspended over depression 14 to provide an electrode-air interface. In operation, when an electric field is created between first and second electrode 16 and 20 via an impressed voltage, the piezoelectric material in PZ layer 18 converts some of the electrical energy into mechanical energy in the form of acoustic waves. The acoustic waves propagate in the same direction as the electric field and reflect off the electrode-air interface.

At the mechanical resonance, the device appears to be an electronic resonator. The mechanical resonant frequency is the frequency for which the half-wave length of the acoustic waves traveling in the device is equal to the total thickness of the device for a given composite phase velocity of sound in the material. Since the velocity of sound is four orders of magnitude smaller than the velocity of light, the resulting resonator can be quite compact. Resonators for applications in the gigahertz (GHz) range may be constructed with physical dimensions on the order of 100 microns in length and a few microns in thickness.

When a passband filter is designed using FBAR 10, it will pass signals in a certain frequency ranges and reject signals outside those ranges. For example, a bandpass filter built with FBAR 10 (or several resonators like FBAR 10) may be designed to pass signals having a frequency range of 1.89 to 1.91 GHz and to reject other signals outside that range. The passband of a filter using FBAR resonators (resonators that only have the pure longitudinal mode) would have a frequency response in the passband that would be quite smooth as a function of frequency. However, excitation of the longitudinal acoustic modes in the FBAR resonator also excites lateral modes.

Similarly, FIG. 1b illustrates a solidly mounted resonator (SMR) that may be used to construct a filter. SMR 30 includes substrate 32, acoustical mirror 34, first electrode 36, piezoelectric (PZ) layer 38, and second electrode 40. First electrode 36, PZ layer 38, and second electrode 40 collectively form SMR membrane 42. SMR membrane 42 is supported on substrate 32 over acoustical mirror 34. Acoustical mirror 34 consists of a number of layers, including low acoustical impedance layers 33 and high acoustical impedance layers 35 which are alternately stacked.

In operation, SMR 30 operates similarly to FBAR 10 as described above. Specifically, when an electrical field is created between first and second electrodes 36 and 40 via an impressed voltage, the piezoelectric material of PZ layer 38 converts some of the electrically energy into mechanical energy in the form of acoustic waves. The acoustic waves propagate in the same direction as the electric field and reflect off the electrode-acoustical mirror interface.

The acoustic resonators illustrated in FIGS. 1a and 1b have characteristics that can be analogized to microwave cavity resonators. FIG. 2 illustrates a microwave traveling inside a cavity 40. As the microwave travels inside the cavity 40 it reflects as it hits the wall of cavity 40. As a result, the energy in the microwave is contained inside cavity 40. If loss is small, a specific oscillation mode can be sustained. The loss through the wall of cavity 40 would be small and the propagation wave (evanescent wave) outside the cavity is attenuated quickly.

Figure 2B:
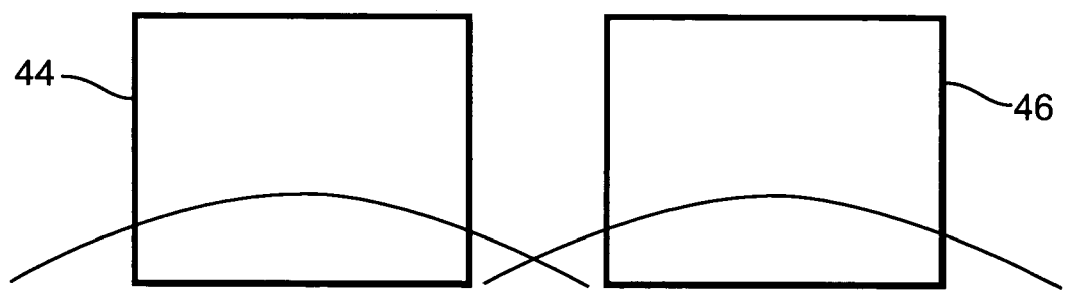
FIG. 2b illustrates electromagnetically coupled cavity resonators.

FIG. 2b illustrates a first and second cavity 44 and 46 placed adjacent one another. The energy contained in first cavity 44 may tunnel into adjacent second cavity 46 and simulate an oscillation. This phenomenon is known as electromagnetic coupling. The strength of the coupling is determined by the amount of energy leaked and on the gap between the first and second cavities 44 and 46.

Figure 3:
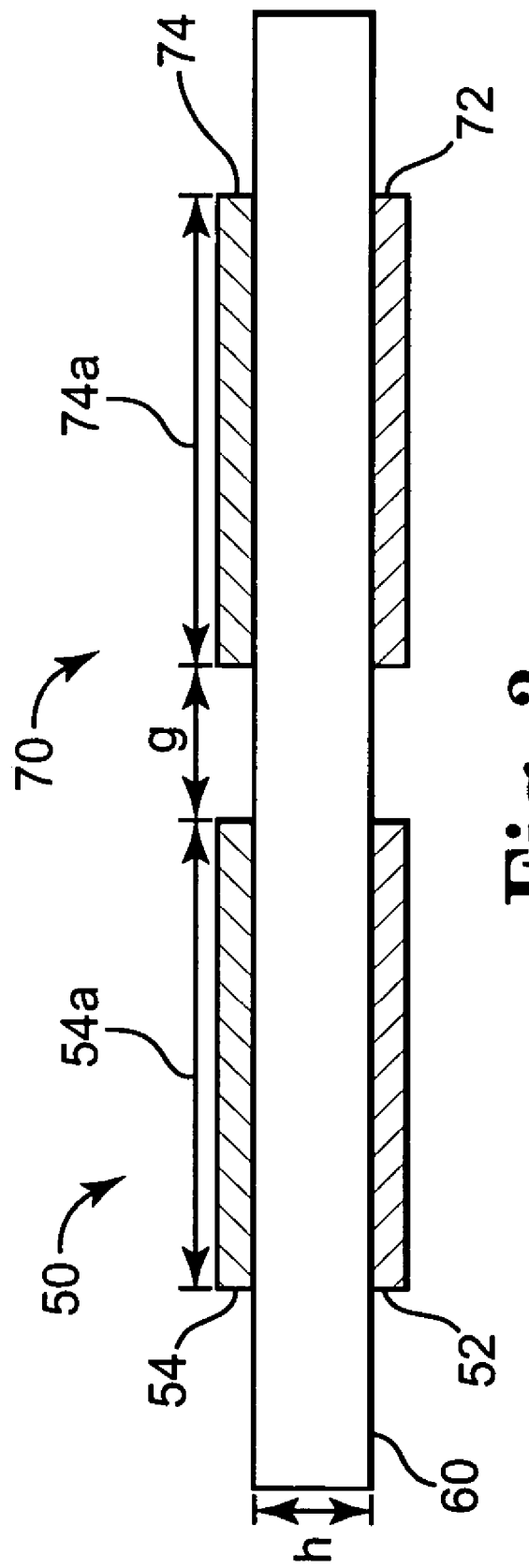
FIG. 3 illustrates two acoustically coupled resonators.

FIG. 3 illustrates a cross-sectional view of first acoustic resonator 50 and second acoustic resonator 70, which are coupled acoustically. First acoustic resonator 50 includes first electrode 52, piezoelectric (PZ) layer 60, and second electrode 54. Second acoustic resonator 70 includes first electrode 72, PZ layer 60, and second electrode 74. First and second acoustic resonators 50 and 70 could be FBAR or SMR resonators as illustrated in FIGS. 1a and 1b. First and second acoustic resonators 50 and 70 are acoustically coupled by being placed in close proximity such that energy in one resonator may be transferred to the adjacent resonator as described with respect to cavity resonator illustrated in FIG. 2b. First acoustic resonator 50 illustrated in FIG. 3 includes second electrode 54, which has an electrode width 54A. Similarly, second acoustic resonator 70 has a second electrode 74, which has an electrode with 74A. Second electrodes 54 and 74 of first and second acoustic resonators 50 and 70 are separated by a gap g. PZ layer 60 has a height indicated by h.

First and second acoustic resonators 50 and 70 are acoustically coupled with a coupling strength K. The coupling strength K may be described by the following equation:

$$K \propto \exp\left(-k\frac{g}{h}\delta^{0.5}\right) \quad \text{Equation I}$$

where k is a constant (depending on vibration mode and material properties), g is the separating gap described above, h is the height of the PZ layer described above, and δ is called plateback. Plateback, or the δ factor is defined by the following equation:

$$\delta = \frac{fu - fe}{fe} \quad \text{Equation II}$$

where fu is the resonance frequency of an unelectroded piezoelectric plate and fe is the resonance frequency of the electroded piezoelectric plate.

In general, fe is smaller then fu due to mass loading from first and second electrodes 52 and 54 and 72 and 74. As illustrated by Equation I, reducing the gap g between first and second resonators 50 and 70 increases the coupling strength K. Also, decreasing the frequency difference between electroded and unelectroded plates, and increasing the thickness h of the piezoelectric plate 60 will increase coupling strength K.

In practice, controlling the distance of gap g between first and second acoustic resonators 50 and 70 is constrained by process tolerances. Also, frequency difference between electroded and unelectroded plates and increasing the thickness h of the piezoelectric plate are constrained by an electromechanical coefficient $k_t^2$ and the resonance frequency of the resonator chosen in the designed filter.

FIGS. 4a–4c illustrate cross-sectional views first and second acoustic resonators 100 and 120 that are acoustically coupled in accordance with one embodiment of the present invention. As with the resonators illustrated in FIG. 3, first and second acoustic resonators 100 and 120 may be configured in a variety of ways consistent with the present invention, including as an FBAR illustrated in FIG. 1a or as a SMR illustrated in FIG. 1b. First acoustic resonator 100 is acoustically coupled to second acoustic resonator 120.

In FIG. 4a, first acoustic resonator 100 includes first electrode 102, piezoelectric (PZ) layer 110 and second electrode 104. Second acoustic resonator 120 includes first electrode 122, PZ layer 110 and second electrode 124. Second electrodes 104 and 124 have an electrode width of 104a and 124a, respectively. Furthermore, second electrodes 104 and 124 are separated by a gap g. A portion or region of second electrodes 104 and 124 represented by 104b and 124b, respectively, is tapered. By changing this edge profile of second electrodes 104 and 124, the coupling strength of the coupled resonators is improved.

By tapering edge regions 104b and 124b of second electrodes 104 and 124 close to gap g, as well as by tapering the corresponding edge regions of first electrodes 102 and 122, the mass loading in the region is reduced. There is also reduction if only the second electrodes 104 and 124 are tapered in the edge region or if only the first electrodes 102 and 122 are tapered in the edge region, but the reduction is larger if both first and second electrodes 102 and 122 and 104 and 124 are tapered. With this tapering, the resonance frequency fe is close to the resonance frequency fu thereby effectively reducing the δ factor. In this way, as evident from Equation I, reduction of the δ factor increases the coupling strength of the resonators.

In FIG. 4a, both first electrodes 102 and 122 and second electrodes 104 and 124 are tapered to reduce the δ factor and increase the coupling strength. Tapering first electrodes 102 and 122, however, also results in a slope in PZ layer 110 in the gap region g. In some instances, this may affect the quality of PZ layer 110 causing potential electrode static discharge failure.

First and second acoustic resonators 100' and 120' are illustrated in FIG. 4b. First acoustic resonator 100' includes a first electrode 106, PZ layer 110' and second electrode 104'. Second acoustic resonator 120' includes first electrode 106', PZ layer 110' and second electrode 124'. First electrodes 106 and 106' are dry etched with a vertical profile. Gap 107 is formed between first electrodes 106 and 106'. In the formation process, a sacrificial material is deposited and a chemical mechanical polish (CMP) process is used on first electrodes 106 and 106' to obtain a flat surface in coupling gap region 107. In this way, relatively planar first electrodes 106 and 106' are obtained such that when PZ layer 110' is deposited over them, it has a relatively flat profile in gap region g.

First and second acoustic resonators 100 and 120 in FIGS. 4a and 100' and 120' in FIG. 4b each have four ports and will thus provide flexibility in constructing different filter topologies. For example, they can be used to construct balance-to-unbalance transformation. Although first and second acoustic resonators 100' and 120' in FIG. 4b provide the four-port flexibility, since first electrodes 106 and 106' are not tapered adjacent gap 107, 100' and 120' in FIG. 4b, its δ factor will not be as favorable as the resonators illustrated in FIG. 4a.

FIG. 4c illustrates first and second acoustic resonators 100" and 120" where a single first electrode 108 is used without any gap. In this way, first acoustic resonator 100" includes first electrode 108, PZ layer 110" and second electrode 104". Similarly, second acoustic resonator 120" includes first electrode 108, PZ layer 110', and second electrode 124'. Since no tapering is used in first electrode 108, a relatively planar PZ layer 110" is achieved. As with first and second acoustic resonators 100 and 120 illustrated in FIGS. 4a and 4b, that illustrated in FIG. 4c also effectively reduces the δ factor, thereby increasing the coupling strength. The reduction of the δ factor with the embodiment illustrated in FIG. 4c, however, is typically less than that with the embodiment illustrated in FIG. 4a. Thus, the coupling strength of the embodiment illustrated in FIG. 4c is typically less than that in the embodiment illustrated in FIG. 4a. Since there is no gap provided in the embodiment illustrated in FIG. 4c, however, there are less processing steps involved in its manufacture than is the case for the embodiment illustrated in FIG. 4b.

First and second acoustic resonators 100" and 120" in FIG. 4c have a shared electrode configuration (first electrode 108), which effectively forms a single-ended-to-single-ended filter. The configuration provides for a somewhat simplified fabrication (relative to the configuration illustrated in FIGS. 4a and 4b), but this configuration does limit the application in constructing different filter topologies.

FIG. 5a illustrates cross-sectional views first and second acoustic resonators 200 and 220 in accordance with one embodiment of the present invention. First acoustic resonator 200 includes first electrode 206, piezoelectric (PZ) layer 210, second electrode 212, and third electrode 214. Second acoustic resonator 220 includes first electrode 206, PZ layer 210, second electrode 224, and third electrode 226. Third electrodes 214 and 226 have widths 214a and 226a, respectively. Gap g separates third electrodes 214 and 226. Regions 214b and 226b of third electrodes 214 and 226 are defined adjacent gap g. As illustrated in FIG. 5a, second electrodes 212 and 224 are recessed relative to third electrodes 214 and 226 in regions 214b and 226b. Thus, third electrodes 214 and 226 overhang second electrodes 212 and 224 in regions 214b and 226b. These overhanged electrodes 214 and 226 effectively excite an acoustical wave with a frequency close to fu resulting in a δ factor that is better than that of the resonator illustrated in FIG. 4c. In this way, coupling strength is increased.

In one embodiment, overhanged electrodes 214 and 226 are achieved by stacking two metal layers of a different type. For example, second electrodes 212 and 224 may be made of molybdenum (Mo) and third electrodes 214 and 226 are made of aluminum (Al). The differing etching characteristics of the different materials may be utilized to selectively etch second electrodes 212 and 224 to achieve the overhanged electrodes 214 and 226.

An alternative embodiment of first and second acoustic resonators 200' and 220' are illustrated in FIG. 5b. First acoustic resonator 200' includes first electrode 202, PZ layer 210', second electrode 212', and third electrode 214'. Second acoustic resonator 220' includes first electrode 222, PZ layer 210', second electrode 224', and third electrode 226'. Third electrodes 214' and 226' have an electrode width 214a' and 226a', respectively. Third electrodes 214' and 226' are separated by gap g. Regions 214b' and 226b' are defined adjacent gap g. First and second acoustic resonators 200' and 220' have a δ factor close to zero since both the first and the second electrodes of each are over-hanged and effectively have no mass-loading effect on the resonance frequency. Thus, coupling strength is thereby increased.

In addition, first electrodes 202 and 222 are also tapered to further enhance coupling strength. In order to achieve tapered first electrodes 202 and 222, a sacrificial material such as silicon dioxide (SiO2) can be used in gap area g after first electrodes 202 and 222 are tapered. In this way, first electrodes 202 and 222 provide a relatively planer surface so that PZ' layer 210 can be formed in a relatively planar manner over the combination of first electrodes 202 and 222 and the sacrificial layer. After first and second acoustic resonators 200 and 220 are fully formed, the sacrificial layer can be removed to achieve the taper in gap region g between first electrodes 202 and 222.

The overhanged electrodes illustrated in FIGS. 5a and 5b can also be reversed such that, for example, third electrodes 214 and 226 are recessed relative to second electrodes 212 and 224. Although the processes for achieving such configurations may be slightly more complex, this arrangement can also achieve a high coupling strength.

FIGS. 6a and 6b illustrate top views of first and second acoustic resonators 240 and 260 in accordance with the present invention. As illustrated, only top electrodes 244 and 264 of first and second acoustic resonators 240 and 260 respectively are visible, but bottom electrodes may also be provided that essentially generally mirror the illustrated top electrodes 244 and 264. In FIG. 6a the length of electrodes 244 and 264 along the gap g is increased utilizing interdigital fingers 244a on electrode 244 and 246a on electrode 264. The edges of the interdigital finger electrodes can also be tapered similar to that illustrated in FIGS. 4a–c and FIGS. 5a and 5b. By interspersing these fingers 244a, the length of each electrode 244 and 264 along the gap g is increased, thereby increasing coupling strength between first and second acoustic resonators 240 and 260. Increasing the length of the corresponding bottom electrodes of first and second acoustic resonators 240 and 260 along the gap g utilizing interdigital fingers further increases coupling strength. Similarly, coupling strength can be enhanced by using slimming electrodes 244' and 264' along gap g as illustrated in FIG. 6b.

Figure 7:
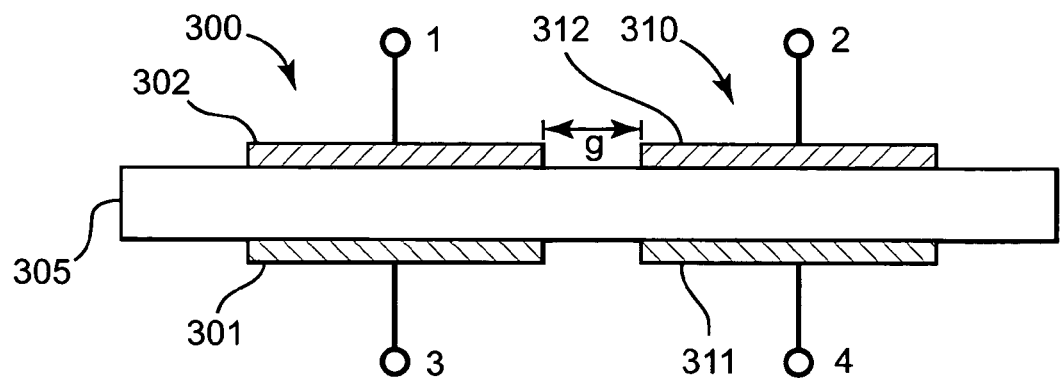
FIG. 7 illustrates two acoustically coupled resonators forming a four-port network in accordance with one embodiment of the present invention.

FIG. 7 illustrates first and second acoustic resonators 300 and 310 acoustically coupled to form a four-port network in accordance with one embodiment of the present invention. First acoustic resonator 300 includes first electrode 301, PZ layer 305, and second electrode 302. Second acoustic resonator 310 includes first electrode 311, PZ layer 305, and second electrode 312. First and second acoustic resonators 300 and 310 may be a variety of acoustic resonators including FBAR and SMR. In addition, second electrodes 302 and 312 are tapered adjacent gap g, which separates them. Such tapering may be achieved in a variety of ways consistent with the present invention. For example, it may be tapered in accordance with one of the embodiments in FIGS. 4a–4c and FIGS. 5a–5b. In addition, first electrodes 301 and 311 may also be tapered in accordance with the present invention. For example, they may be tapered as described in one of the embodiments in FIG. 4a and FIG. 5b.

First and second acoustic resonators 300 and 310 are acoustically coupled in a four-port network such that port 1 is coupled to electrode 302, port 2 is coupled to electrode 312, port 3 is coupled to electrode 301, and port 4 is coupled to electrode 311. Such a four-port network may be used to achieve impedance and single-to-differential transformation. With port 3 grounded, the network illustrated in FIG. 7 is capable of converting single-ended input to differential output. By choosing different impedance for first acoustic resonator 300 and second acoustic resonator 310, the network can transform the impedance. This functionality may be very useful for a variety of filter applications.

Figure 8A:
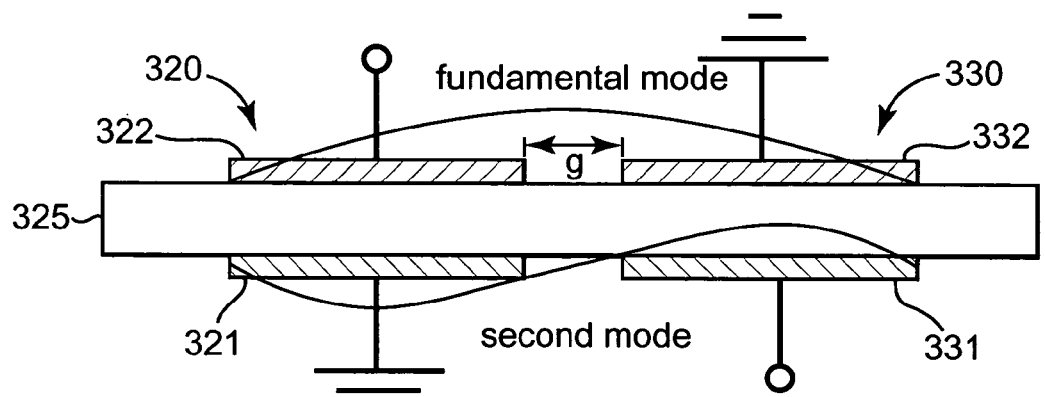
FIG. 8a illustrates a double mode filter using tapered acoustic resonators to couple the fundamental and the second mode in accordance with one embodiment of the present invention.

FIG. 8a illustrates first and second acoustic resonators 320 and 330 formed into a two-resonator network. First acoustic resonator 320 includes first electrode 321, PZ layer 325, and second electrode 322. Second acoustic resonator 330 includes first electrode 331, PZ layer 325, and second electrode 332. First and second acoustic resonators 320 and 330 may be a variety of acoustic resonators including FBAR and SMR. In addition, first and/or second electrodes 321, 331, 332, and/or 332 may be tapered adjacent gap g which separates them, similar to that described above with respect to one of the embodiments in FIGS. 4–5.

As illustrated, first and second acoustic resonators 320 and 330 can be acoustically coupled to create a double-mode filter (DMF). As such, the DMF filter can be a powerful building block for synthesizing filters in various applications. FIG. 8a illustrates a DMF filter capable of coupling the fundamental and the second mode.

Figure 8B:
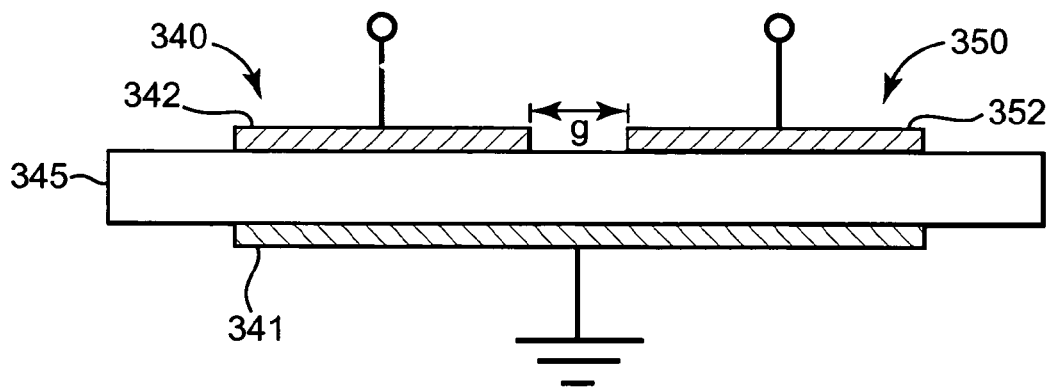
FIG. 8b illustrates a double mode filter using tapered acoustic resonators and a shared electrode to couple the fundamental and the second mode in accordance with one embodiment of the present invention.

FIG. 8b similarly illustrates a sample DMF filter with a slightly easier fabrication version. In this illustrated embodiment, first and second acoustic resonators 340 and 350 share a single electrode 341. In this way, first acoustic resonator 340 includes first electrode 341, PZ layer 345, and second electrode 342. Similarly, second acoustic resonator 350 includes first electrode 341, PZ layer 345, and second electrode 352. Again, first and second acoustic resonators 340 and 350 may be a variety of acoustic resonators including FBAR and SMR. In addition, second electrodes 342 and 352 are tapered adjacent gap g, which separates them. Again, such tapering may be achieved in a variety of ways including those illustrated in one of the embodiments in FIGS. 4–5.

Figure 9:
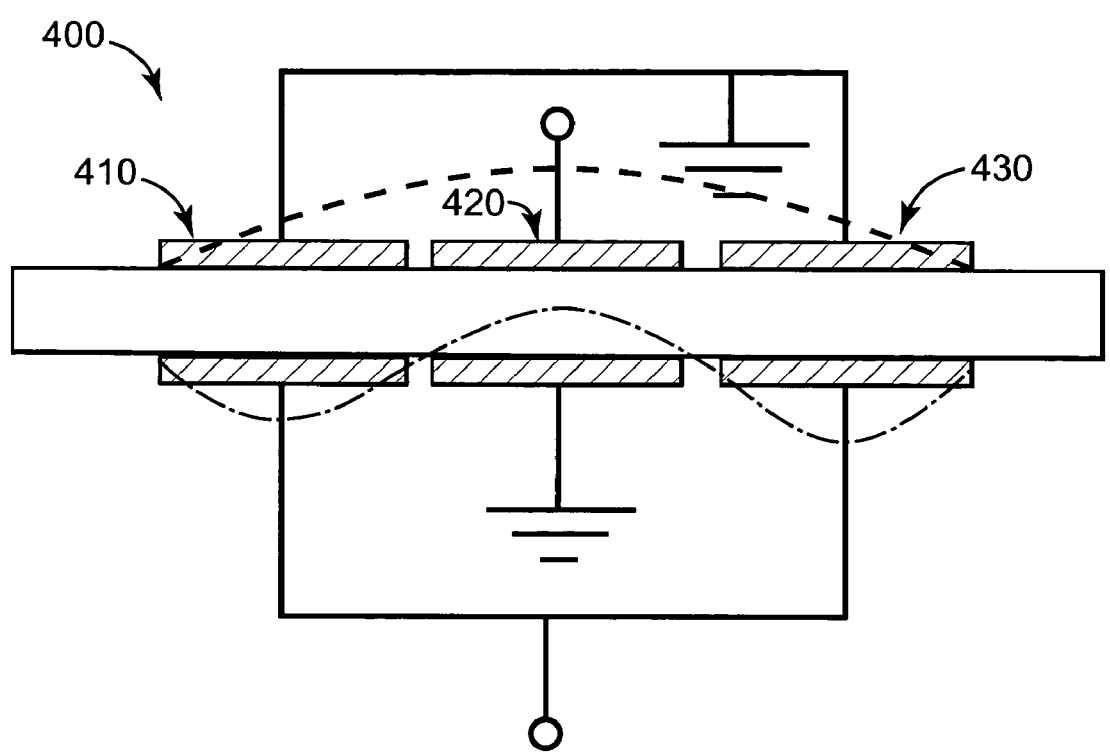
FIG. 9 illustrates a double mode filter using three tapered acoustic resonators in accordance with one embodiment of the present invention.

The present invention may also be used to created resonator networks larger than two resonators. For example, FIG. 9 illustrates an alternatively configured network 400 that forms a double-mode filter using three resonators with the fundamental mode and the third mode. Network 400 includes first, second, and third acoustic resonators 410, 420, and 430. As with the previously described acoustic resonators, first, second, and third acoustic resonators 410, 420, and 430 each include a PZ layer sandwiched between first and second electrodes. Also, similar to that described above, at least some of the electrodes in acoustic resonators 410, 420, and 430 are tapered adjacent a gap that separates them. Such tapering may be achieved in a variety of ways including those illustrated in one of the embodiments of FIGS. 4–5. In the illustrated network 400, the fundamental and the third mode are coupled with first, second, and third acoustic resonators 410, 420 and 430.

Figure 10A:
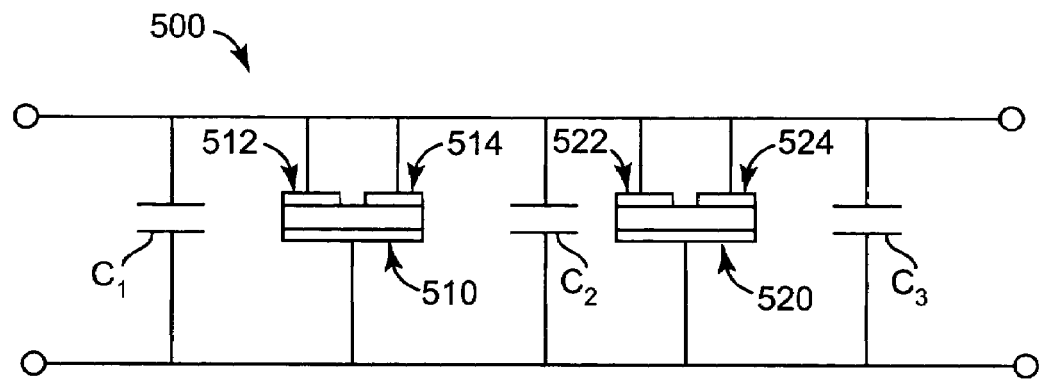
FIG. 10a illustrates a filter circuit consisting of two cascaded double mode filters using tapered acoustic resonators in accordance with one embodiment of the present invention.

FIG. 10a illustrates a filter circuit 500 in accordance with one embodiment of the present invention. Filter circuit 500 includes first acoustically-coupled-resonator pair 510 and second acoustically-coupled-resonator pair 520 connected as two cascaded DMFs with capacitors $C_1$, $C_2$, and $C_3$. First acoustically-coupled-resonator pair 510 includes first acoustic resonator 512 and second acoustic resonator 514, which are acoustically coupled and each have electrodes with tapered edges similar to that described above with respect to one of the embodiments in FIGS. 4–5, for example. Similarly, second acoustically-coupled-resonator pair 520 includes first acoustic resonator 522 and second acoustic resonator 524, which are acoustically coupled and each have electrodes with tapered edges similar to that described above with respect to one of the embodiments in FIGS. 4–5, for example.

Filter circuit 500 configured in this way may be used in conjunction with a variety of applications. For example, filter circuit 500 can be used in Wideband Code-Division Multiple-Access (WCDMA) applications. WCDMA is a main technology for the implementation of third generation cellular systems, and filter circuit 500 illustrates one useful application in such technologies.

Figure 10B:
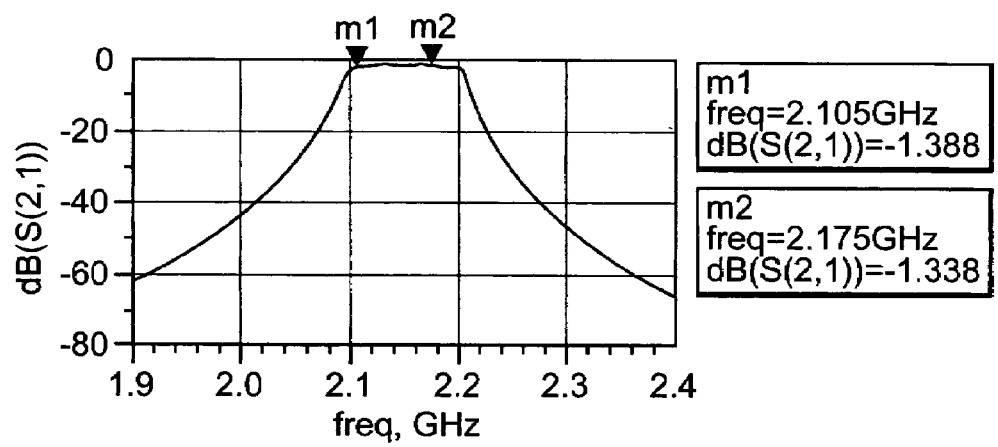

FIG. 10b illustrates a typical simulated characteristic for filter circuit 500 illustrated in FIG. 10a. In the illustrated filter characteristic, the x-axis represents frequency and the y-axis represents the ratio between the stimulation (input) and the response (output) simulated in s-parameter with dB unit.

In one embodiment, filter circuit 500 is configured to have a passband between 2.105 GHz and 2.175 GHz. Points m1 and m2 in FIG. 10b illustrate the edges of the passband of filter 500. As illustrated on the x-axis in FIG. 10b, dB(s(2,1)) is the transfer function of filter 500 simulated in s-parameter with dB units. In the illustrated example, at the passband dB(s(2,1))=−1.338.

Figure 11A:
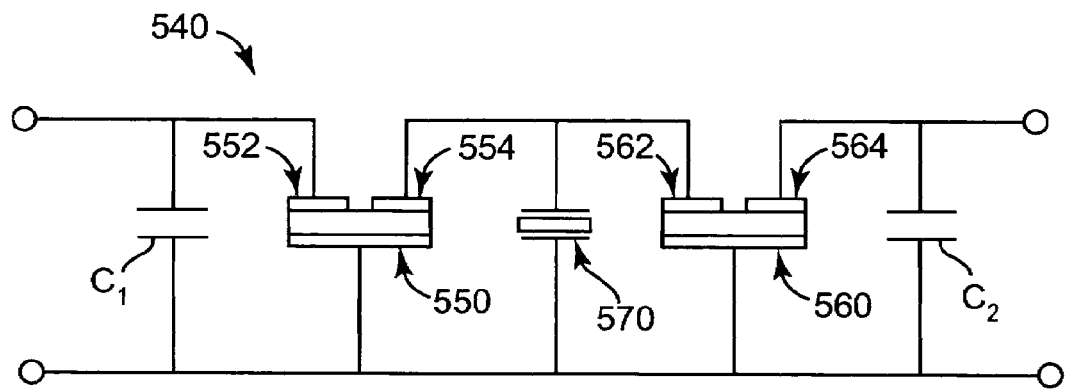
FIG. 11a illustrates a filter circuit consisting of two cascaded double mode filters using tapered acoustic resonators and a shunt FBAR resonator in accordance with one embodiment of the present invention.

FIG. 11a illustrates a filter circuit 540 in accordance with one embodiment of the present invention. Filter circuit 540 includes first acoustically-coupled-resonator pair 550 and second acoustically-coupled-resonator pair 560 connected as two cascaded DMFs, and further includes a shunt FBAR resonator 570 and capacitors $C_1$ and $C_2$. First acoustically-coupled-resonator pair 550 includes first acoustic resonator 552 and second acoustic resonator 554, which are acoustically coupled and each have electrodes with tapered edges similar to that described above with respect to one of the embodiments in FIGS. 4–5, for example. Similarly, second acoustically-coupled-resonator pair 560 includes first acoustic resonator 562 and second acoustic resonator 564, which are acoustically coupled and each have electrodes with tapered edges similar to that described above with respect to one of the embodiments in FIGS. 4–5, for example.

Filter circuit 540 configured with a shunt FBAR between a cascaded acoustically-coupled-resonator pair can create a sharp roll-off on the low frequency side of the passband that may be useful in a variety of applications. For example, filter circuit 540 may be used in conjunction with Digital Cellular System (DCS) applications. DCS is a technology used, for example, in Europe, and filter circuit 540 illustrates a useful application in such technologies.

Figure 11B:
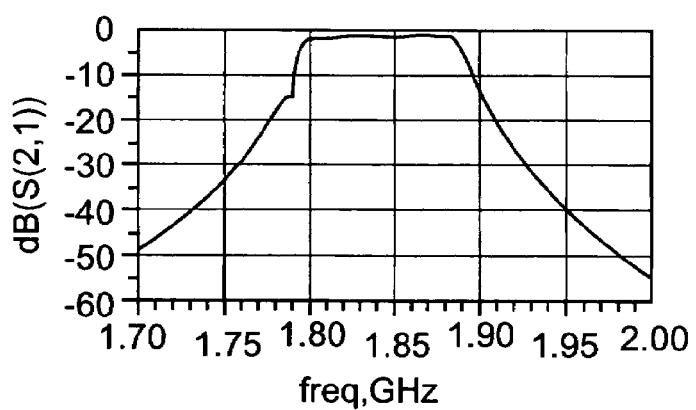

FIG. 11b illustrates a typical simulated characteristic for filter circuit 540 illustrated in FIG. 11a. In the illustrated filter characteristic, the x-axis represents frequency and the y-axis represents the ratio between the stimulation (input) and the response (output) simulated in s-parameter with dB unit.

In one embodiment, filter circuit 540 is configured to have a passband between 1.80 GHz and 1.86 GHz. As illustrated on the x-axis in FIG. 11b, dB(s(2,1)) is the transfer function of filter 540 simulated in s-parameter with dB units.

Figure 12:
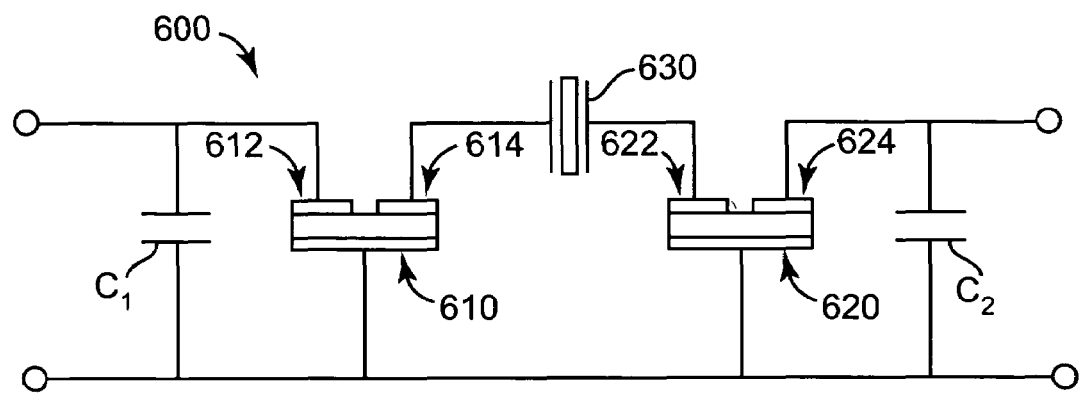
FIG. 12 illustrates a filter circuit consisting of two cascaded double mode filters using tapered acoustic resonators and a series FBAR resonator in accordance with one embodiment of the present invention.

FIG. 12 illustrates a filter circuit 600 in accordance with one embodiment of the present invention. Filter circuit 600 includes first acoustically-coupled-resonator pair 610 and second acoustically-coupled-resonator pair 620 connected as two cascaded DMFs, and further includes a series FBAR resonator 630 and capacitors $C_1$, and $C_2$. First acoustically-coupled-resonator pair 610 includes first acoustic resonator 612 and second acoustic resonator 614, which are acoustically coupled and each have electrodes with tapered edges similar to that described above with respect to one of the embodiments in FIGS. 4–5, for example. Similarly, second acoustically-coupled-resonator pair 620 includes first acoustic resonator 622 and second acoustic resonator 624, which are acoustically coupled and each have electrodes with tapered edges similar to that described above with respect to one of the embodiments in FIGS. 4–5, for example.

Filter circuit 600 configured with a series FBAR between a cascaded acoustically-coupled-resonator pair can create a sharp roll-off on the high frequency side of the passband that may be useful in a variety of applications. For example, filter circuit 600 configured in this way may be used in similar applications as described above, but may have better roll-off on high frequency side of the passband than filter circuit 540 above. Specifically, in one application, filter circuit 600 may be used in a transmitter application, where better roll-off on the high side of the passband is more important, and filter circuit 540 may be used as a receiver application, where better roll-off on the low side of the passband is more important.

Figure 13:
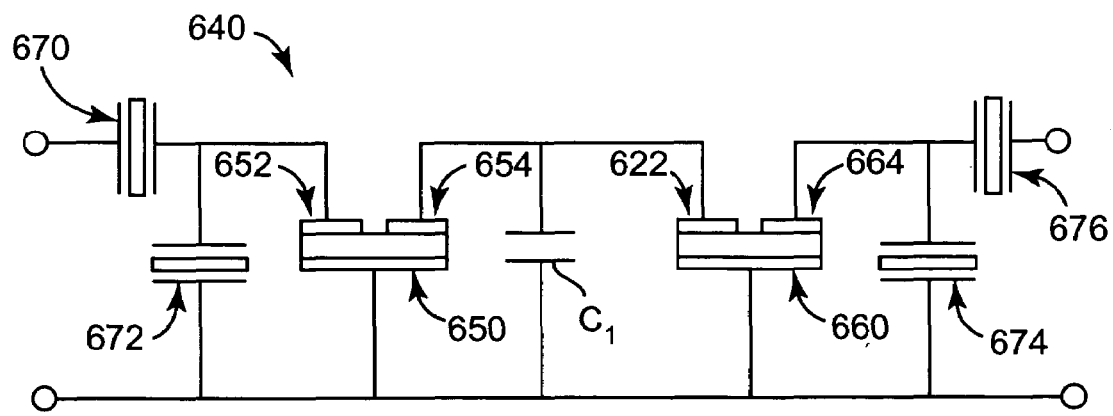
FIG. 13 illustrates a hybrid filter circuit consisting of a half ladder and two cascaded double mode filters using tapered acoustic resonators in accordance with one embodiment of the present invention.

FIG. 13 illustrates a filter circuit 640 in accordance with one embodiment of the present invention. Filter circuit 640 is a hybrid filter circuit consisting of a half ladder and first acoustically-coupled-resonator pair 650 and second acoustically-coupled-resonator pair 660 connected as two cascaded DMFs. The half ladder of filter circuit 640 includes FBAR resonators 670, 672, 674 and 676 and capacitor $C_1$. First acoustically-coupled-resonator pair 650 includes first acoustic resonator 652 and second acoustic resonator 654, which are acoustically coupled and each have electrodes with tapered edges similar to that described above with respect to one of the embodiments in FIGS. 4–5, for example. Similarly, second acoustically-coupled-resonator pair 660 includes first acoustic resonator 662 and second acoustic resonator 664, which are acoustically coupled and each have electrodes with tapered edges similar to that described above with respect to one of the embodiments in FIGS. 4–5, for example.

Filter circuit 640 configured in this way may be used in similar applications as described above, but may have better roll-off on both sides of passband than filter circuits 540 and 600 above.

Figure 14A:
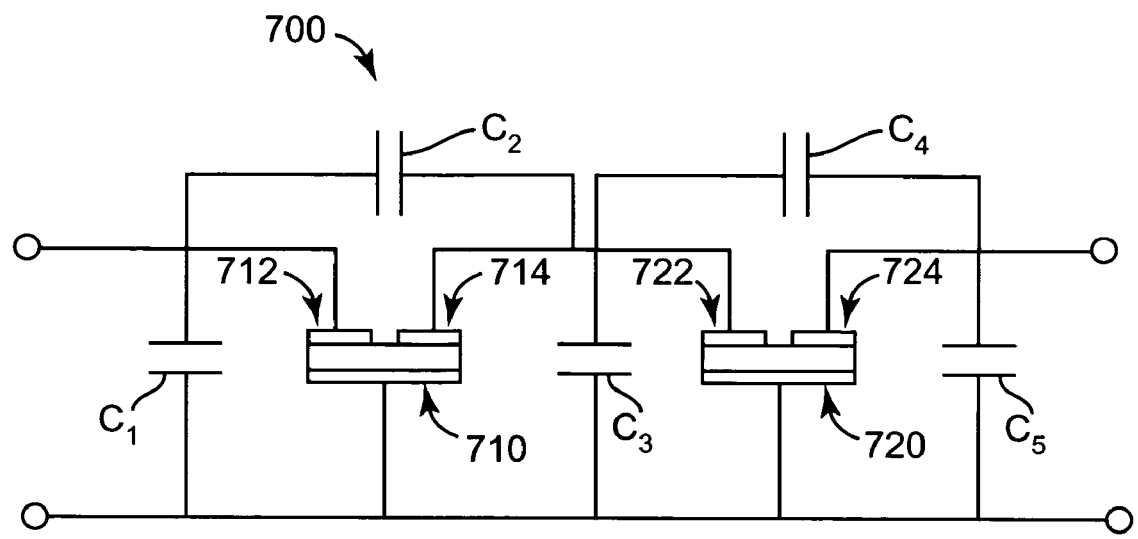
FIG. 14a illustrates a filter circuit consisting of two cascaded double mode filters using tapered acoustic resonators with bridge-capacitor coupling in accordance with one embodiment of the present invention.

FIG. 14a illustrates a filter circuit 700 in accordance with one embodiment of the present invention. Filter circuit 700 is a bridge-capacitor-coupled network including first acoustically-coupled-resonator pair 710 and second acoustically-coupled-resonator pair 720 with bridge capacitors $C_2$ and $C_4$ across them. Bridging capacitors $C_2$ and $C_4$ across the acoustically-coupled-resonator pairs can introduce transmission zeros on both sides of the passband, thereby improving the roll-off of the passband such that filter circuit 700 may be used in similar applications as described above. This effect is similar to that produced by filter circuit 640 above, but with a simpler configuration.

First acoustically-coupled-resonator pair 710 includes first acoustic resonator 712 and second acoustic resonator 714, which are acoustically coupled and each have electrodes with tapered edges similar to that described above with respect to one of the embodiments in FIGS. 4–5, for example. Similarly, acoustically-coupled-resonator pair 720 includes first acoustic resonator 722 and second acoustic resonator 724, which are acoustically coupled and each have electrodes with tapered edges similar to that described above with respect to one of the embodiments in FIGS. 4–5, for example.

Figure 14B:
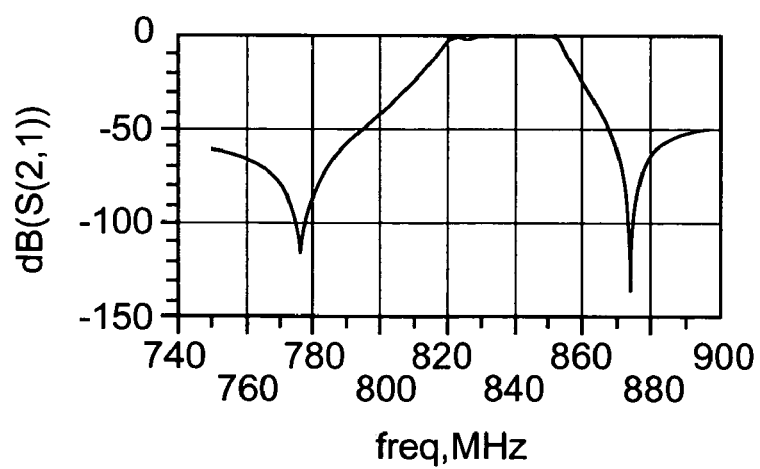

FIG. 14b illustrates a typical simulated characteristic for filter circuit 700 illustrated in FIG. 14a. In the illustrated filter characteristic, the x-axis represents frequency and the y-axis represents the ratio between the stimulation (input) and the response (output) simulated in s-parameter with dB unit.

In one embodiment, filter circuit 700 is configured to have a passband between 1.805 GHz and 1.885 GHz. As illustrated on the x-axis in FIG. 14b, dB(s(2,1)) is the transfer function of filter 700 simulated in s-parameter with dB units. This transition is sharper on either side of the passband illustrating the improved roll-off.

Figure 15:
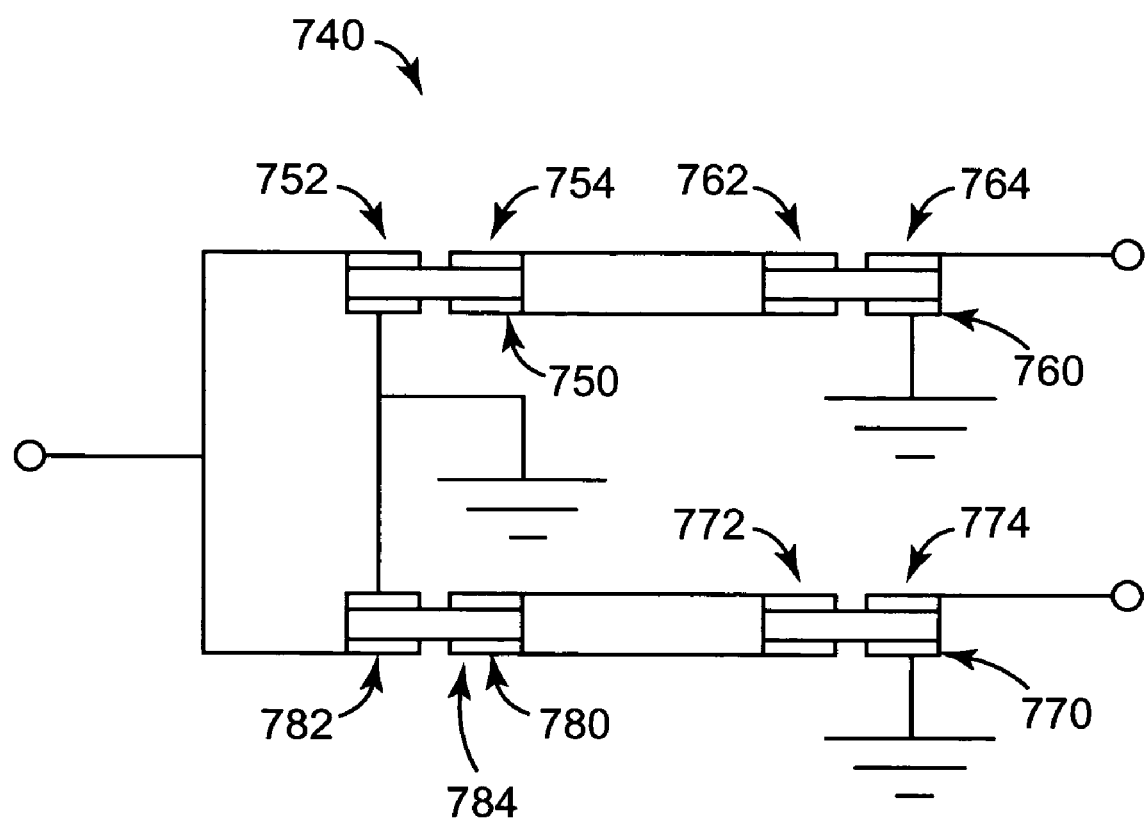
FIG. 15 illustrates a filter with unbalance-to-balance and 1-to-4 impedance transformations using tapered acoustic resonators in accordance with one embodiment of the present invention.

FIG. 15 illustrates a filter circuit 740 in accordance with one embodiment of the present invention. Filter circuit 740 has 1-to-4 impedance transformations and unbalance-to-balance conversion and includes first acoustically-coupled-resonator pair 750, second acoustically-coupled-resonator pair 760, third acoustically-coupled-resonator pair 770, and fourth acoustically-coupled-resonator pair 780. First acoustically-coupled-resonator pair 750 includes first acoustic resonator 752 and second acoustic resonator 754, which are acoustically coupled and each have electrodes with tapered edges similar to that described above with respect to one of the embodiments in FIGS. 4–5, for example. Similarly, second, third and fourth acoustically-coupled-resonator pairs 760, 770 and 780 each respectively include first acoustic resonators 762, 772, and 774 and second acoustic resonators 764, 774, and 784, which are acoustically coupled and each have electrodes with tapered edges similar to that described above with respect to one of the embodiments in FIGS. 4–5, for example.

Filter circuit 740 configured in this way may be used for impedance and unbalance-to-balance transformations.

Figure 16A:
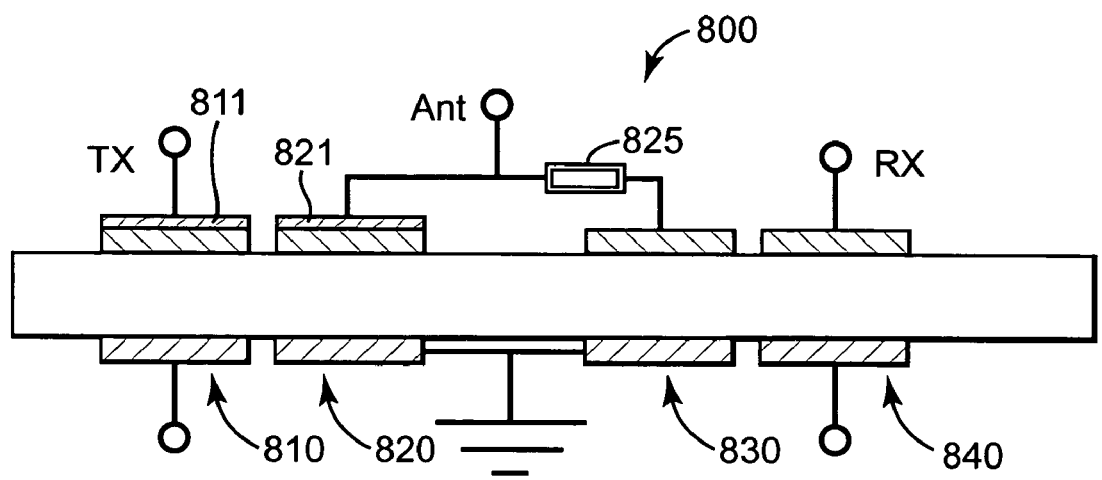
FIG. 16a illustrates a schematic of single chip duplexer with double mode filters using tapered acoustic resonators and having differential receiver and transmitter inputs and single-ended antenna in accordance with one embodiment of the present invention.

FIG. 16a illustrates duplexer chip 800 in accordance with one embodiment of the present invention. Chip 800 is illustrated as a single chip duplexer with double mode filters using tapered acoustic resonators and having differential receiver and transmitter inputs. Chip 800 includes first acoustically-coupled-resonator pair 810 and 820 and second acoustically-coupled-resonator pair 830 and 840. Duplexer chip 800 has three terminals: a Tx terminal, an Rx terminal, and an antenna. Resonator 810 is connected to the Tx terminal and resonator 840 to the Rx terminal. Resonators 820 and 830 are connected to the antenna. In one embodiment, both first resonator pair 810 and 820 and second resonator pair 830 and 840 are coupled over a single piezoelectric layer, and each include electrodes with tapered edges similar to that described above with respect to one of the embodiments in FIGS. 4–5, for example. In one embodiment, upper layers 811 and 821 are added to resonators 810 and 820 in order to differentiate the frequency response of first acoustically-coupled-resonator pair 810 and 820 from second acoustically-coupled-resonator pair 830 and 840. Also, quarter-wavelength transmission line 825 is added to isolate the receiver Rx from the transmitter Tx.

Using one mass-loading step, filters with slightly different frequency can be easily made on a single substrate, which makes it very attractive for duplexer application. With acoustical coupling, there is no direct electrical pass from Tx to Rx, a natural isolation between transmitter and receiver.

Figure 16B:
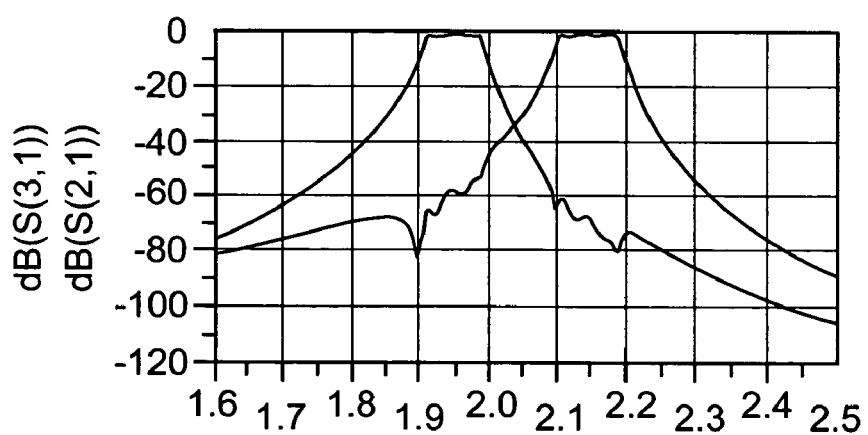

FIG. 16b illustrates a typical simulated characteristic for filter circuit 800 illustrated in FIG. 16a. In the illustrated filter characteristic, the x-axis represents frequency and the y-axis represents the ratio between the stimulation (input) and the response (output) simulated in s-parameter with dB unit.

In one embodiment, filter circuit 800 is configured to have one passband between 1.91 GHz and 1.99 GHz and another between 2.1 GHz and 2.18 GHz. As illustrated on the x-axis in FIG. 16b, dB(s(2,1)) and dB(s(3,1)) are the transfer functions of filter 800 simulated in s-parameter with dB units. In one embodiment, the simulated characteristic represents a WCDMA duplexer.

Figure 17:
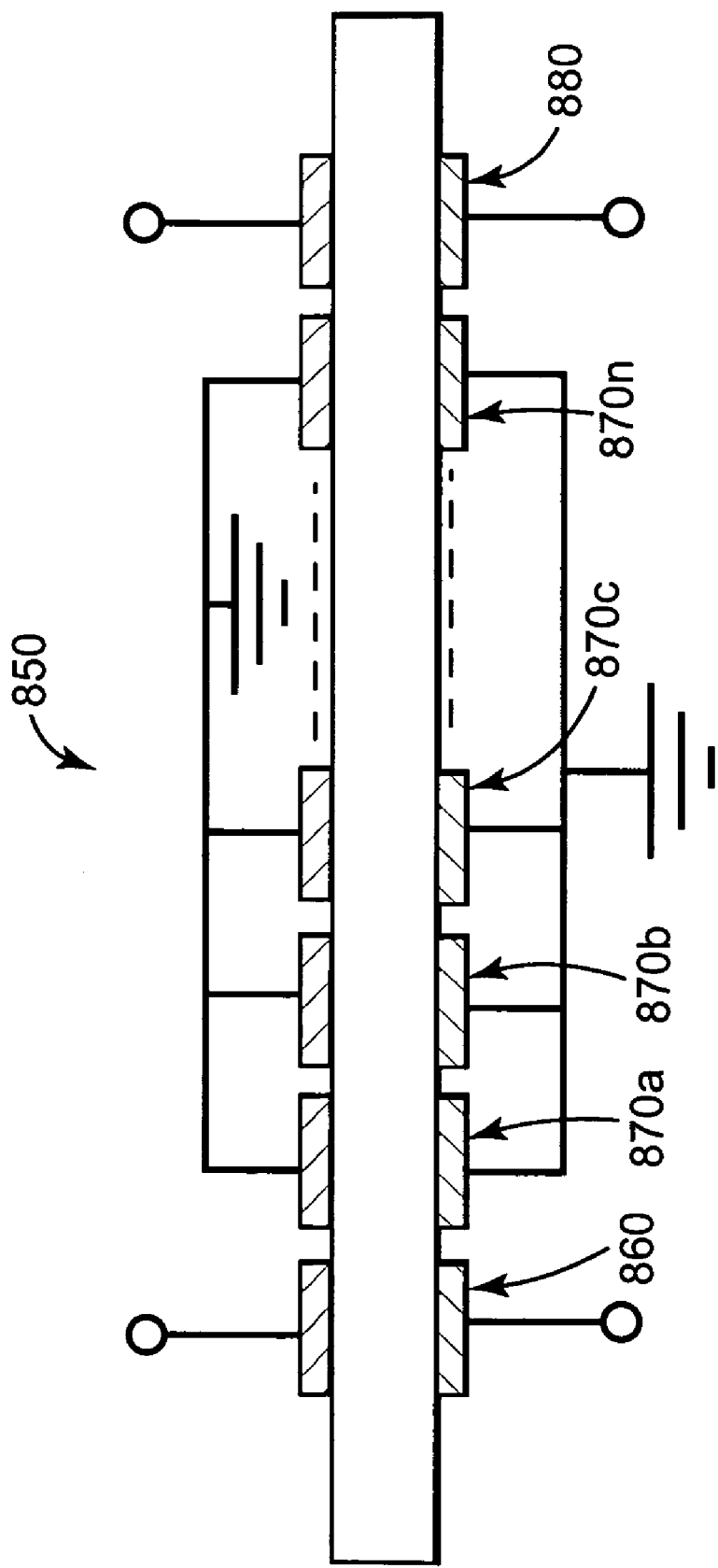
FIG. 17 illustrates a higher order filter acoustically coupling a plurality of tapered resonators in accordance with one embodiment of the present invention.

FIG. 17 illustrates high order filter 850 in accordance with one embodiment of the present invention. Filter 850 resonators 860 and 880, which are acoustically coupled to a plurality of acoustic resonators 870a–870n. Any of a variety of numbers of acoustic resonators 870 can be added to filter 850. In one embodiment, the acoustic resonators 860, 870 and 880 are coupled over a single piezoelectric layer, and each include electrodes with tapered edges similar to that described above with respect to one of the embodiments in FIGS. 4–5, for example. A higher order filer is easily accomplished by coupling more resonators acoustically as illustrated in FIG. 17.

Figure 18A:
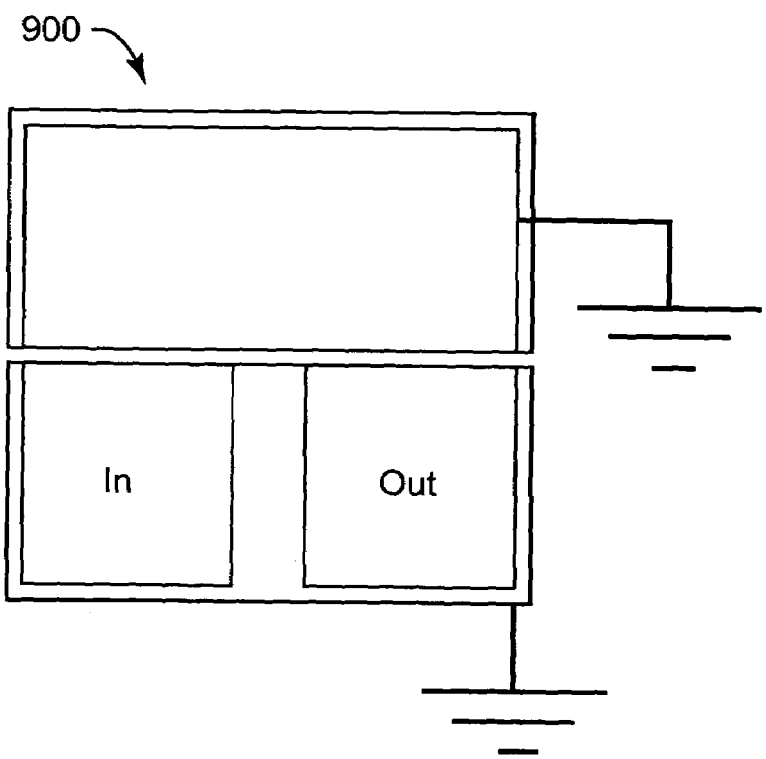
FIG. 18a illustrates a layout of two-resonator double mode filters using tapered resonators in accordance with one embodiment of the present invention.
Figure 18B:
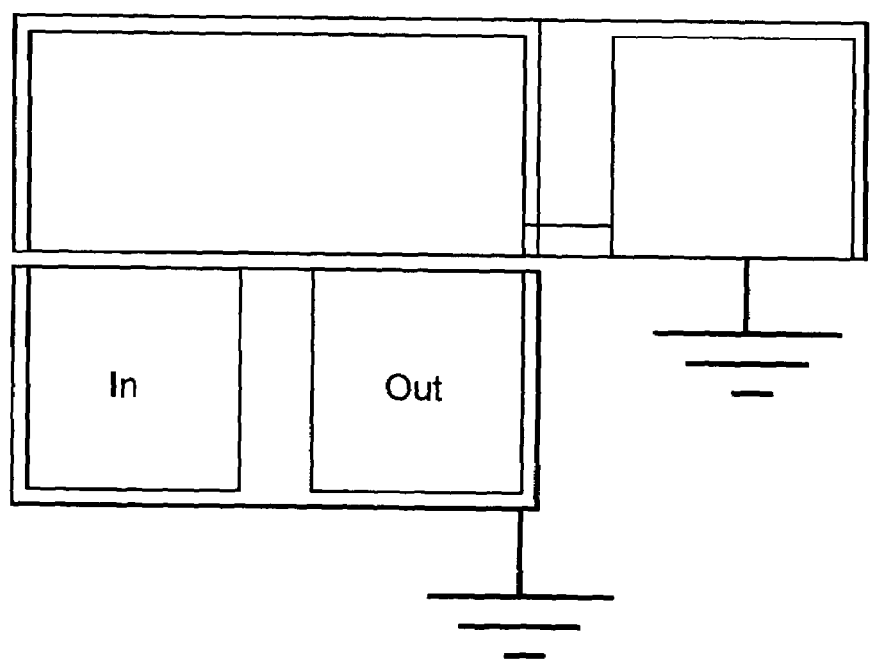
FIG. 18b illustrates a layout of two-resonator double mode filters using tapered resonators and a shunt FBAR resonator in accordance with one embodiment of the present invention.

Finally, layouts for two-resonator DMF 900 and DMF with a shunt FBAR resonator 910 in accordance with one embodiment of the present invention are illustrated in FIGS. 18a and 18b, respectively.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:
1. Acoustically coupled resonators comprising:
 a first acoustic resonator comprising:
  a layer of piezoelectric material having first and second surfaces;
  a first electrode of the first acoustic resonator adjacent the first surface of the layer of piezoelectric material;
  a second electrode of the first acoustic resonator adjacent the second surface of the layer of piezoelectric material; and
 a second acoustic resonator comprising:

a first electrode of the second acoustic resonator adjacent the first surface of the layer of piezoelectric material; and a second electrode of the second acoustic resonator adjacent the second surface of the layer of piezoelectric material;

wherein the first and second acoustic resonators are acoustically coupled, wherein the second electrode of the first acoustic resonator is separated from the second electrode of the second acoustic resonator, and wherein the second electrode of the first acoustic resonator has an edge that is tapered.

2. The acoustically coupled resonators of claim 1 wherein the first and second acoustic resonators are formed over a substrate.

3. The acoustically coupled resonators of claim 1 wherein the second electrode of the second acoustic resonator also has an edge that is tapered.

4. The acoustically coupled resonators of claim 3 wherein the first electrode of the first acoustic resonator is separated from the first electrode of the second acoustic resonator and each of the first electrodes of the first and second acoustic resonators have an edge that is tapered.

5. The acoustically coupled resonators of claim 1 wherein the layer of piezoelectric material is a single layer that is shared by the first and second acoustic resonators.

6. The acoustically coupled resonators of claim 1 wherein the first electrode of the first acoustic resonator and the first electrode of the second acoustic resonator are one single electrode layer.

7. The acoustically coupled resonators of claim 1 wherein the second electrode of the first acoustic resonator and the second electrode of the second acoustic resonator are separated by a gap and wherein both the second electrodes of the first and second acoustic resonators have an edge adjacent that gap that is tapered.

8. The acoustically coupled resonators of claim 1 wherein the first acoustic resonator further includes a third electrode adjacent the second electrode, the second electrode of the first acoustic resonator being recessed relative to the third electrode of the first acoustic resonator, wherein the second acoustic resonator further includes a third electrode adjacent the second electrode, the second electrode of the second acoustic resonator being recessed relative to the third electrode of the second acoustic resonator, wherein the third electrodes of the first and second acoustic resonators are separated by a gap, and wherein the third electrodes of the first and second acoustic resonators each have an edge that is tapered adjacent the gap.

9. The acoustically coupled resonators of claim 1 wherein the first and second electrodes of the first and second acoustic resonators are separated by a gap and have interdigital fingers separating them in the gap.

10. The acoustically coupled resonators of claim 1 further comprising:

a third acoustic resonator comprising:

a first electrode of the third acoustic resonator adjacent the first surface of the layer of piezoelectric material and separated from the first electrodes of the first and second acoustic resonators; and a second electrode of the third acoustic resonator adjacent the second surface of the layer of piezoelectric material and separated from the second electrodes of the first and second acoustic resonators;

wherein the first, second and third acoustic resonators are acoustically coupled, and wherein the first and second electrodes of the third acoustic resonator each have an edge that is tapered.

11. First and second acoustically coupled resonators comprising:

a substrate;

a first electrode of the first acoustic resonator adjacent the substrate;

a first electrode of the second acoustic resonator adjacent the substrate;

a layer of piezoelectric material adjacent the first electrodes of the first and second acoustic resonators wherein the layer of piezoelectric material is a single layer that is shared by the first and second acoustic resonators;

a second electrode of the first acoustic resonator adjacent the layer of piezoelectric material; and a second electrode of the second acoustic resonator adjacent the layer of piezoelectric material;

wherein the second electrode of the first acoustic resonator is separated from the second electrode of the second acoustic resonator, and wherein the second electrode of the first acoustic resonator has an edge that is tapered.

12. The acoustically coupled resonators of claim 11 wherein the second electrode of the second acoustic resonator also has an edge that is tapered.

13. The acoustically coupled resonators of claim 12 wherein the first electrode of the first acoustic resonator is separated from the first electrode of the second acoustic resonator and each of the first electrodes of the first and second acoustic resonators have an edge that is tapered.

14. The acoustically coupled resonators of claim 11 wherein the first electrode of the first acoustic resonator and the first electrode of the second acoustic resonator are one single electrode layer.

15. A filter circuit comprising:

a first acoustically-coupled-resonator pair comprising:

a first resonator having a layer of piezoelectric material sandwiched between first and second electrodes; and a second resonator having a layer of piezoelectric material sandwiched between first and second electrodes;

wherein the second electrodes of the first and second resonators are separated by a gap and are tapered adjacent the gap; and a second acoustically-coupled-resonator pair comprising:

a third resonator having a layer of piezoelectric material sandwiched between first and second electrodes; and a fourth resonator having a layer of piezoelectric material sandwiched between first and second electrodes;

wherein the second electrodes of the third and fourth resonators are separated by a gap and are tapered adjacent the gap.

16. The filter circuit of claim 15 wherein the first and second resonators of the first acoustically-coupled-resonator pair share a single layer of piezoelectric material, wherein the third and fourth resonators of the second acoustically-coupled-resonator pair share a single layer of piezoelectric material, wherein the first electrodes of the first and second resonators are separated by a gap and are tapered adjacent the gap, and wherein the first electrodes of the third and fourth resonators are separated by a gap and are tapered adjacent the gap.

17. The filter circuit of claim 15 configured as a double mode filter for coupling a fundamental mode and at least one other mode.

18. The filter circuit of claim 15 configured in a cascaded double mode filter circuit including a shunt acoustic resonator.

19. The filter circuit of claim 15 configured in a cascaded double mode filter circuit including a series acoustic resonator.

20. The filter circuit of claim 15 wherein a bridge capacitor is implemented across the acoustically-coupled-resonator pairs.

21. The filter circuit of claim 15 configured in a single chip duplexer, wherein the first and second acoustically-coupled-resonator pairs share a single layer of piezoelectric material.

22. The filter circuit of claim 15 configured as a hybrid structure with acoustically-coupled-resonator pairs and half ladders having series and shunt resonators.

23. The filter circuit of claim 15 configured as a high order filter.

* * * * *